US006219380B1

United States Patent
Wang et al.

(10) Patent No.: US 6,219,380 B1
(45) Date of Patent: Apr. 17, 2001

(54) PULSE POSITION MODULATION BASED TRANSCEIVER ARCHITECTURE WITH FAST ACQUISITION SLOT-LOCKED-LOOP

(75) Inventors: Wei-Chen Wang; Kuang-Hu Huang; Chorng-Kuang Wang, all of Taipei; Ten-Long Dan, Hsinchu, all of (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/003,485

(22) Filed: Jan. 6, 1998

Related U.S. Application Data

(60) Provisional application No. 60/045,000, filed on Apr. 28, 1997.

(51) Int. Cl.$^7$ .................................................. H03K 7/04
(52) U.S. Cl. ........................ 375/239; 329/313; 332/112
(58) Field of Search .................................. 375/239, 345, 375/359, 360, 361, 376, 219; 329/313, 314; 332/112

(56) References Cited

U.S. PATENT DOCUMENTS

| | | | |
|---|---|---|---|
| 5,563,916 | * 10/1996 | Scarpa .................................. | 375/345 |
| 5,914,989 | * 6/1999 | Thapar et al. ....................... | 375/341 |
| 5,917,372 | * 6/1999 | Kakura et al. ....................... | 330/129 |
| 5,917,865 | * 6/1999 | Kopmeiners et al. ............... | 375/345 |

* cited by examiner

Primary Examiner—Don N. Vo

(74) Attorney, Agent, or Firm—Proskauer Rose, LLP

(57) ABSTRACT

A transceiver has a pulse position modulation (PPM) encoder, automatic gain control (AGC) circuit and timing recovery circuit. The PPM encoder illustratively has a frequency divider, slot selector, and mixer. The frequency divider divides the frequency of a clock signal to which the data of the non-return to zero (NRZ) signal are aligned to produce a half frequency clock signal. The slot selector selects pulses of the clock signal and the half frequency clock signal depending on logic values of the NRZ signal and a control signal to produce first and second slot selected signals. The mixer mixes the first and second slot selected signals to produce a PPM signal of the NRZ signal. The AGC circuit illustratively has a variable gain amplifier, a hysteresis comparator, an event detector, a timer, and a counter. The variable gain amplifier amplifies the PPM signal using a dynamically adjusted gain that depends on an inputted digital control value. The counter increments the inputted digital control value according to a clock signal outputted from the timer to increase the gain. The hysteresis comparator detects a signal level of the amplified PPM signal. The event detector causes the counter to decrease the inputted digital control value if the signal level is outside of a predetermined signal level range. The timing recovery circuit has a frequency track, a slot locked loop and a phase locked loop. The frequency track generates a coarse clock fx having a frequency that depends on a frequency of the PPM signal. The slot locked loop generates a resampling clock signal having a frequency that depends on the course clock fx and having slots locked to slots of the PPM signal. The phase locked loop locks a phase of the coarse clock fx to a phase of the PPM signal.

17 Claims, 7 Drawing Sheets

PULSE POSITION MODULATION BASED TRANSCEIVER ARCHITECTURE WITH FAST ACQUISITION SLOT-LOCKED-LOOP

RELATED APPLICATIONS

This application claims benefit of Provisional Application Ser. No. 60/045,000, filed Apr. 28, 1997.

This application is related to the following patents:

(1) U.S. Pat. No. 5,451,902, entitled "Fully Differential CMOS Transconductance Transimpedence Wide-Band Amplifier," filed on Oct. 18, 1993 for Po-Chiun Huang, Chorng-Kuang Wang, Wen-Chi Wu and Yuh-Diahn Wang; and (2) U.S. Pat. No. 5,581,212, entitled "Fully Differential CMOS Transconductance Transimpedence Wide-Band Amplifier," filed on Mar. 13, 1995 for Po-Chiun Huang, Chorng-Kuang Wang, Wen-Chi Wu and Yuh-Diahn Wang.

The above-listed patent applications are assigned to the same assignee as this application and are incorporated herein by reference.

FIELD OF THE INVENTION

The present invention pertains to communication systems and is particularly applicable to IR and RF wireless communication systems.

BACKGROUND OF THE INVENTION

Recently, demand has increased for providing mobile communications and easily deployed network communications. Much attention has been focused on RF and IF wireless communications systems and techniques for providing such types of communications. However, the RF communication spectrum is rather crowded. Therefore, many developers have recently focused on providing communications using the IR spectrum.

The IR communications channel proposes a number of challenges for the developer. Most notably, the environment in which a typical IR wireless communications system is to be deployed, such as an office building, warehouse or other enclosed structure, is fraught with interference sources such as the sun and lamps (fluorescent, filament, inverter fluorescent, etc.). In addition, it is desirable for some IR wireless communications systems to reduce the amount of power dissipated in the wireless communicating terminals. For example, in the context of portable transceivers, it is desirable to reduce the amount of power dissipated in transmitting information to conserve battery power.

The prior art has proposed pulse-position modulated transceivers for both wireless and wired communications. See H. K. Lu, T. H. Taur, K. C. Chen, C. K. Wang & M. T. Shih, *Prototyping an Indoor High Speed Diffuse Infrared Transceiver for Wireless Data Communications*, SINGAPORE ICCS/'94, p. 338–342 (1994); M. Audeh, J. Kahn & J. Barry, Performance of Pulse-Position Modulation on Measured Non-Directed Indoor Intrared Channels, IEEE Trans. On Comm., vol. 44, no. 6, June, 1996, p. 654–659; M. Rittler, F. Gfeller, W. Hirt, D. Rogers & S. Gowda, *Circuit and System Challenges in IR Wireless Communication,* ISSCC96, Feb. 10, 1996, SP 25.1; K. Yamazaki, *On a New Detection Scheme of Optical PPM Signal,* PROC. INT'L SYMP. INFOR. THEORY (1995); and U.S. Pat. No. 4,584, 720. In such systems, the data to be communicated is formulated into a non-return to zero (NRZ) signal. Such an NRZ signal is pulse position modulated onto a carrier signal to produce a pulse position modulated (PPM) signal. The PPM signal includes variably spaced pulses, the relative location of which depends on transitions of the NRZ signal from a low level to a high level or from a high level to a low level. In particular, the PPM signal is divided into fixed length groups having $2^i$ pulse positions or "slots" per group. Depending on the corresponding signal level of the NRZ signal, a pulse is selectively inserted into a particular slot of the group. That is, a train of pulses is produced in selected slots of the PPM signal, whose phase depends upon the polarity of the NRZ signal at the corresponding time.

The PPM signal thus formed may be inputted to a light emitting diode and transmitted in electromagnetic form to a receiver. The receiver has a photo diode which receives the electromagnetic PPM signal and converts it to electrical (i.e., voltage/current) form. The receiver amplifies the PPM signal, and may use an automatic gain control (AGC) circuit to vary the gain of the amplifier. A demodulator demodulates the NRZ signal from the PPM signal. The demodulator may employ a phase locked loop and/or slot clock to synchronize with the received PPM signal. The recovered NRZ signal may then be further processed, e.g., error corrected, processed, etc.

It is desirable to provide a simple and expandable PPM transceiver with a simple PPM encoder and a robust receiver that quickly locks onto, i.e., synchronizes with, a received PPM signal.

SUMMARY OF THE INVENTION

This and other objects are achieved by the present invention. According to one embodiment, a transmitter is provided with a PPM encoder having a frequency divider, slot selector, and mixer. Such a transmitter illustratively can PPM encode an NRZ signal as follows. The frequency divider divides the frequency of a clock signal to which the data of the NRZ signal are aligned to produce a half frequency clock signal. The slot selector selects pulses of the clock signal and the half frequency clock signal depending on logic values of the NRZ signal and a control signal to produce first and second slot selected signal. The mixer mixes the first and second slot selected signals to produce a PPM signal of the NRZ signal. A haze eliminator illustratively may also be provided for eliminating haze in the PPM signal.

According to another embodiment, a receiver is provided with an automatic gain control circuit, including a variable gain amplifier, a hysteresis comparator, an event detector, a timer, and a counter. Such an AGC circuit can regulate the signal level of a PPM signal as follows. The variable gain amplifier amplifies the PPM signal using a dynamically adjusted gain that depends on an inputted digital control value. The counter increments the inputted digital control value according to a clock signal outputted from the timer to increase the gain. The hysteresis comparator detects a signal level of the amplified PPM signal. The event detector causes the counter to decrease the inputted digital control value if the signal level is outside of a predetermined signal level range.

According to another embodiment, the receiver has a timing recovery circuit for synchronizing to an incoming PPM signal, including a frequency track, a slot locked loop and a phase locked loop. Such a timing recovery circuit can lock synchronization to an incoming PPM signal as follows. The frequency track generates a coarse clock fx having a frequency that depends on a frequency of the PPM signal. The slot locked loop generates a resampling clock signal having a frequency that depends on the course clock fx and having slots locked to slots of the PPM signal. The phase locked loop locks a phase of the coarse clock fx to a phase of the PPM signal.

Illustratively, the frequency track includes a frequency detector for counting the number N of clock pulses of a references clock between rising edges of a PPM signal on which a sequence of logic '1' data bits is modulated. The frequency track may also have a programmable counter for generating the coarse clock fx having a frequency that depends on the frequency of the PPM signal on which the sequence of logic '1' data bits is modulated.

Illustratively, the slot locked loop has a PPM encoder, a slot detector and a slot selection control signal generator. The PPM encoder is for generating the resampling clock signal with pulses of the same duration as the coarse clock signal fx inserted into specific slots as determined by dynamically varying slot selection signals. The slot detector is for comparing pulses of the resampling clock signal to pulses of the PPM signal to determine a phase error between the resampling PPM signal and the PPM signal. The slot selection control signal generator is for varying the slot selection signals if the phase error exceeds 90°.

Illustratively, the phase locked loop has a phase detector and a counter. The phase detector determines a polarity of a phase error between the coarse clock fx and the PPM signal. The counter inserts or deletes a pulse into the coarse clock fx depending on a polarity of the phase error.

According to a further embodiment, a transceiver is provided including the PPM modulator for transmitting NRZ signals, the AGC circuit for amplifying received PPM signals and the timing recovery circuit for synchronizing to the amplified received PPM signals.

DETAILED DESCRIPTION OF THE INVENTION

The invention is illustrated below for a wireless IR communication transceiver. The invention is applicable to both direct line of sight and diffuse transmission systems. In addition, those having ordinary skill in the art will appreciate the applicability of the present invention to wireless communications of other bands of the electromagnetic spectrum and to wired communications devices. The invention is also applicable to communicating voice, audio, video data and other types of information, in a continuous, bursty or interactive fashion.

Figure 1:
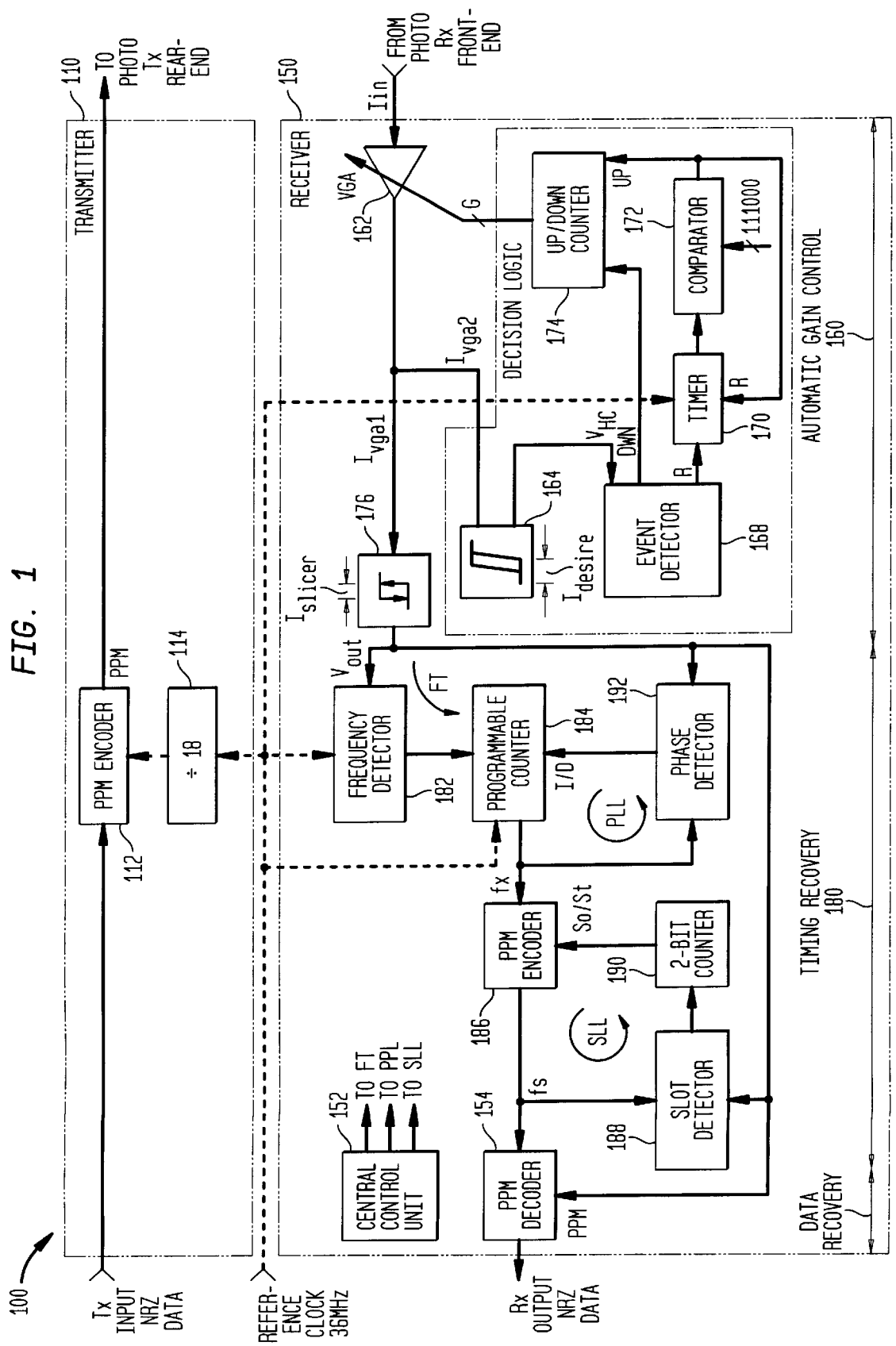
FIG. 1 shows a PPM transceiver according to an embodiment of the present invention.

FIG. 1 shows a transceiver 100 according to an embodiment of the present invention. Illustratively, the transceiver 100 communicates data at a 1 MHZ rate (1 Mbit/sec) using a 4-ary PPM encoding technique. Those having ordinary skill in the art will appreciate that this is merely illustrative—a different data rate and a different ary PPM encoding technique may be used. A 4-ary PPM encoding technique may be desired in certain applications to reduce overall average power consumption of a transceiver.

The transceiver 100 has a transmitter 110 and a receiver 150. The transmitter 110 includes a PPM modulator or encoder 112 and a frequency divider 114. A reference clock signal of 36 MHZ is received at the frequency divider 114, which divides the clock signal by 18 to produce a 2 MHZ clock signal. The PPM encoder 112 receives a to-be-transmitted NRZ data signal and the 2 MHZ clock signal and outputs a PPM signal with the NRZ data signal pulse position modulated thereon.

Figure 2:
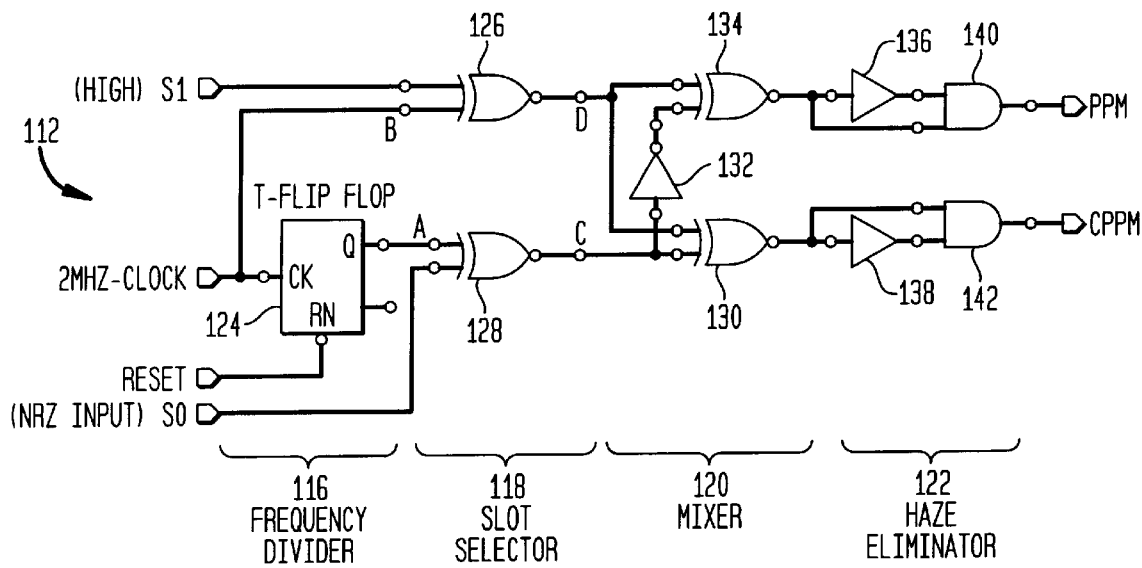
FIG. 2 shows a PPM modulator/encoder according to an embodiment of the present invention.
Figure 3:
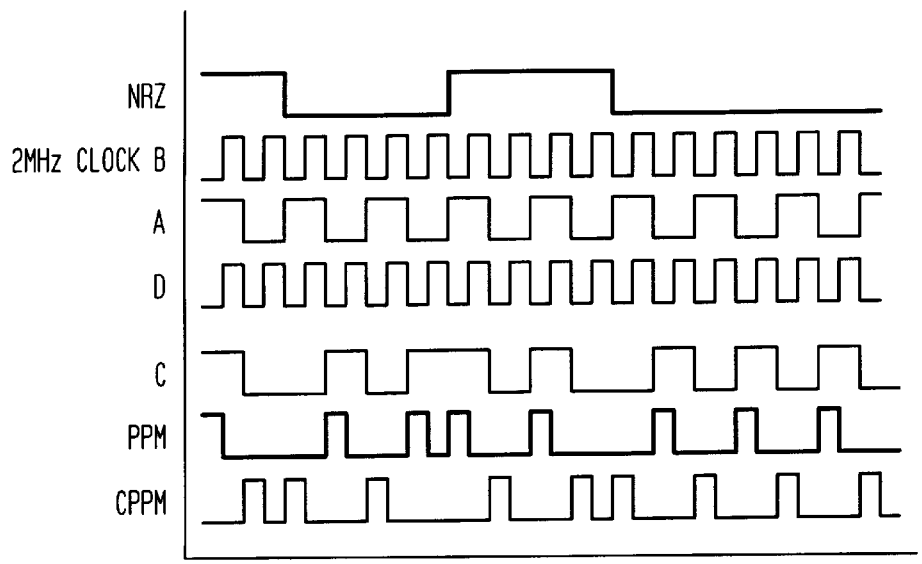
FIG. 3 shows a graph illustrating the generation of a PPM signal according to an embodiment of the present invention.

FIG. 2 shows the PPM encoder 112 in greater detail. The principle of operation of the PPM encoder 112 is to obtain a data clock signal for the NRZ signal and a carrier signal having uniformly space pulses at $2^{i-1}/(i-1)$ times the frequency of the data clock signal of the NRZ signal (e.g., $2^{i-1}/(i-1)\cdot 1$ MHZ for a 1 MHZ NRZ signal) for a $2^i$-ary PPM encoding scheme. This carrier signal is then mixed (logically multiplied) with the data clock signal as gated by the NRZ signal. To that end, the 2 MHZ signal is formed from the reference signal to serve as the carrier signal. Illustratively, the pulses of the carrier signal are edge-wise aligned in phase with the NRZ signal. The 2 MHZ carrier signal is inputted to a frequency divider 116 to generate the data clock signal. Illustratively, the frequency divider 116 is formed from a T or toggle flipflop 124 that receives the 2 MHZ carrier signal B at its input and outputs the data clock signal A at its output as shown in FIG. 3. As will be appreciated from the discussion below, the T flipflop 124 is an implementation of an i-bit counter that resets when the $i^{th}$ counter bit is set (and thus counts only i–1 bits) for the simple case of i=2.

Note that the derivation of the data clock signal A from the carrier signal B enables generation of a rather precise PPM pulse and duration even though neither a phase nor a duration controller is employed.

The data clock signal A, carrier signal, NRZ signal and slot select control signal S1 are fed to a slot selector 118. The slot selector 118 selects the particular slots of each group of $2^i$ slots in which to produce pulses depending on slot select control signal S1 and the NRZ signal (which serves as slot select control signal S0). To that end, the carrier signal is exclusive-NOR'ed with the slot select control signal S1 in exclusive-NOR circuit 126 and the data clock signal A is exclusive-NOR'ed with the NRZ signal in exclusive-NOR circuit 128. The slot selected signals D and C outputted from the XOR circuits 126 and 128, respectively are shown in FIG. 3. Illustratively, the slot select control signal S1 and the NRZ signal S0 determine in which slots to insert pulses according to the following truth table:

TABLE 1

| S0 | S1 | Slot |
|----|----|------|
| 0  | 0  | 4    |
| 0  | 1  | 3    |
| 1  | 0  | 2    |
| 1  | 1  | 1    |

With S1 set to logic '1', pulses are inserted into slot 1 when the NRZ signal is a logic '1' and slot 3 when the NRZ signal is a logic '0'.

The provision of the slot selector 118 enables flexible insertion of pulses in any of the available slots.

The actual insertion of pulses into selected slots is performed by the mixer 120 which receives the signals D and C. Illustratively, the mixer 120 has a NOR gate 130 which receives the signals C and D and outputs the logic NOR of these signals. Signal C is furthermore received at inverter 132 which produces the complement of signal C, namely, signal CC. The signals CC and D are received at a second NOR gate 134 of the mixer 120 which produces the logic NOR of these signals.

A haze eliminator 122 may be provided to remove the tiny residual pulse that might be produced by the frequency divider 116. As shown, the haze eliminator 122 includes two one-shot circuits—a first formed from inverter 136 and AND gate 140 and a second formed from inverter 138 and AND gate 142. The AND gate outputs the PPM signal and the AND gate 142 outputs the complement of the PPM signal, namely, CPPM as shown in FIG. 3. The PPM signal is then outputted to the light emitting diode and transmitted.

Figure 4:
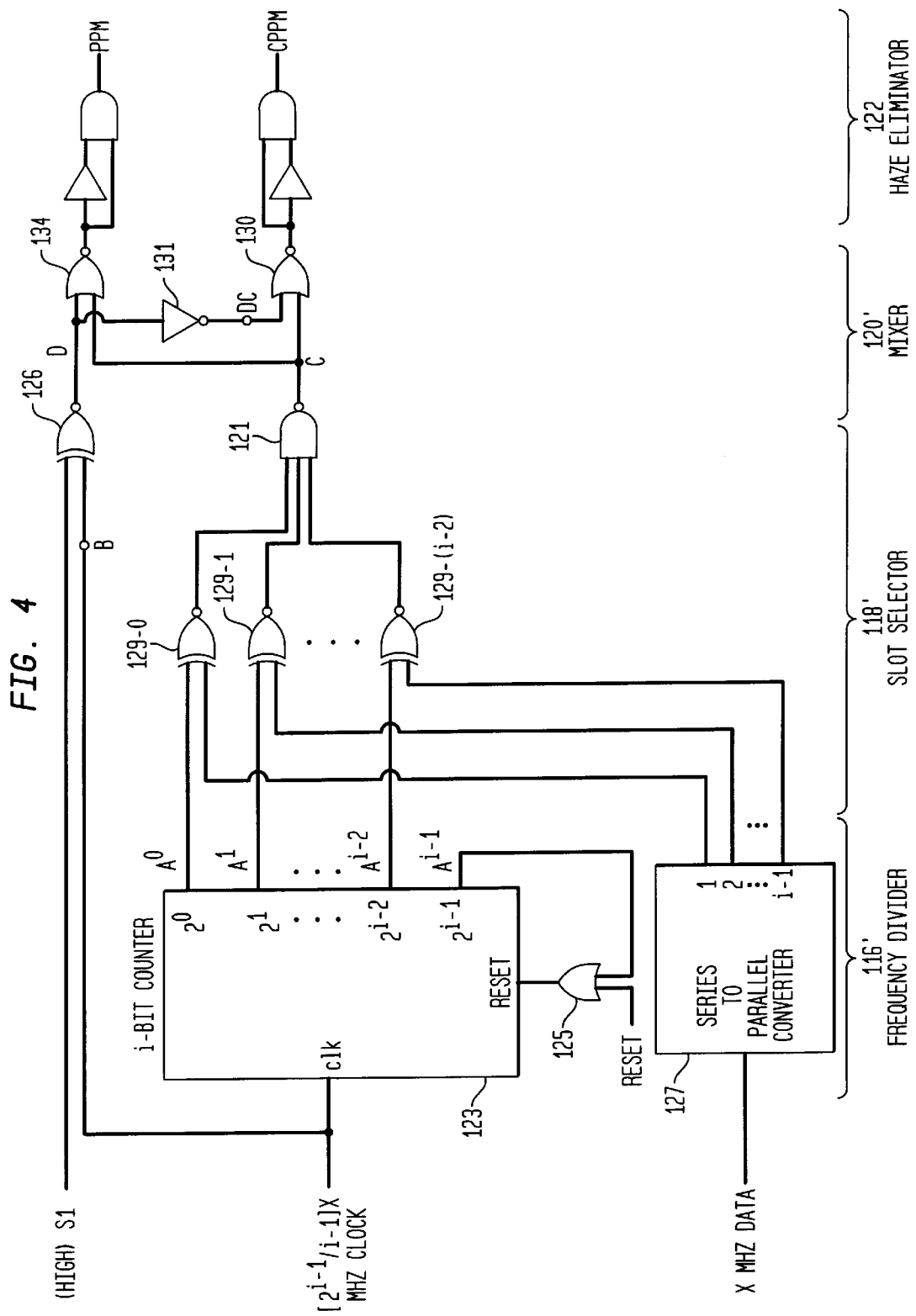
FIG. 4 shows a PPM modulator/encoder according to another embodiment of the present invention.

Note that the PPM encoder 112 can easily be extended to accommodate any $2^i$-ary PPM encoding scheme. FIG. 4 shows a PPM encoder according to another embodiment for a general $2^i$-ary PPM encoding scheme. The T flip flop 124 of the frequency divider 116 is replaced with an i-bit counter 123 and an OR gate 125 in frequency divider 116'. The i-bit counter 123 receives a $2^{i-1}/(i-1) \cdot X$ MHz carrier signal at its clock input. As in FIG. 2, the $2^{i-1}/(i-1) \cdot X$ MHz carrier signal is also received at the input B of the slot selector 118'. The i-bit counter 123 produces an i bit count from outputs $2^{i-1} 2^{i-2} \ldots 2^1 2^0$. The OR gate 125 receives the most significant count bit $2^{i-1}$ as a first input and an externally generated reset signal RESET at its second input. The output of the OR gate 125 is connected to the reset input of the i-bit counter 123. Thus, the OR gate 125 causes the i-bit counter to reset at count $2^{i-1} 2^{i-2} \ldots 2^1 2^0 =$'10 . . . 00' or when the external RESET signal is logic '1'. The frequency divider 116' illustratively also has a series to parallel converter 127 for receiving an X MHz NRZ data signal and producing symbols that each have i-1 bits. Each symbol is outputted from the series to parallel converter at a symbol rate of $1/(i-1) \cdot X$ MHz.

Consider the signal produced by each outputted bit of the counter 123, namely, the signal $A_0$ outputted from output bit $2^0$, the signal $A_1$ outputted from output bit $2^1$ . . . and the signal $A_{i-2}$ outputted from output bit $2^{i-2}$ of the counter 123. Each can be considered a clock signal $A_j$ with a frequency of $2^{i-1}/[2^j \cdot (i-1)] \cdot X$ MHz. Thus, each of the symbol bits modulates a different clock signal $A_0, A_1, \ldots, A_{i-2}$ having a frequency of $2^{i-1}, 2^{i-2}, \ldots 2^0$, respectively, times the frequency of the symbol rate. The modulation of clock signals $A_0, A_1, \ldots, A_{i-2}$ by bits 1, 2, . . . , i-1 of each symbol, respectively, is achieved by a respective exclusive-NOR gate 129-0, 129-1, . . . , 129-(i-2) of the slot selector 118'. The outputs of the exclusive-NOR gates are combined, in particular, logically NAND'ed by NAND gate 121.

The construction of the mixer stage 120' is also slightly different. Most notably, the signal C produced by the NAND gate 130 is fed to both NOR gates 130 and 134. The input signal D is fed to NOR gate 134. Input signal D is also received at an inverter 131 which produces the complement signal DC. Signal DC is also received at NOR gate 130.

Referring again to FIG. 1, the receiver 150 is shown as having an AGC circuit 160, followed by a timing recovery circuit 180. Also provided are a central control unit 152 for generating timing signals for use by the timing recovery circuit 180 and a PPM decoder 154 for decoding a received PPM signal after the timing recovery circuit 180 has synchronized to the received PPM signal.

The received PPM signal has a highly varying peak-to-peak amplitude. The purpose of the AGC circuit 160 is to stabilize the gain of the received PPM signal while reducing the amount of jitter introduced into the PPM signal pulses. The AGC circuit 160 includes a variable gain amplifier (VGA) 162 and a hysteresis slicer or quantizer 176 in a feed forward path. A feedback path is provided from the output of the VGA 162 to a control input of the VGA 162 including a hysteresis comparator 164, an event detector 168, a timer 170, a comparator 172 and an up/down counter 174. The timer 170 receives the 36 MHZ reference clock signal.

A PPM current signal $I_{in}$ is received via a photo diode at the VGA 162. The current signal $I_{in}$ advantageously is generated by feeding a PPM voltage signal $V_{in}$ from the photo diode to a transconductance stage within the VGA 162. The VGA 162 amplifies the current signal $I_{in}$ to produce signal $I_{vga1}$ using a dynamically varying gain that depends on a digital control value G received from the up/down counter 174. The VGA 162 also produces a current signal $I_{vga2}$ which is outputted through the feedback path for adjusting the gain of the VGA 162.

The purpose of the feedback path is to vary the gain of the VGA 162 so as to stabilize the amplitude level of $I_{vga1}$. This is achieved as follows. The signal $I_{vga2}$, which is related to $I_{vga1}$, is received at the hysteresis circuit 164. The hysteresis circuit 163 has a hysteresis window of $I_{desire}$. When the amplitude of $I_{vga2}$ is less than the lower bound of $I_{desire}$, the hysteresis circuit 164 outputs a low voltage level in signal $V_{HC}$. When the amplitude of $I_{vga2}$ is greater than the upper bound of $I_{desire}$, the hysteresis circuit 164 outputs a high voltage level in signal $V_{HC}$. The signal $V_{HC}$ is received at the event detector 168. The event detector 168 may be of the form of an edge detector which detects the falling edge of each pulse of $V_{HC}$. In response to a peak-to-peak current amplitude of $I_{vga2}$ that alternately falls below the lower bound, and exceeds the upper bound, of the window $I_{desire}$ (i.e., in response to detecting a falling edge), the event detector 168 outputs a reset signal and a down count signal DWN. The reset signal R resets the timer 170 which begins to count up from zero (e.g., with each pulse of the 36 MHz reference clock). The current time of the timer 170 is compared in the comparator 172 to a reference value. For example, the reference value may be some predetermined value, such as $111000_2$. This corresponds to 56 clock periods of the 36 MHz reference clock. In response to the timer count equaling the reference value, the comparator 172 outputs the up count signal UP to the counter 174. The up count signal UP also is received at the timer 170 and resets the timer 170 so that it begins to count from zero.

The counter 174 receives the up count signal UP and the down count signal DWN. In response to the up count signal UP, the counter 174 increments its count G. In response to the down count signal DWN, the counter 174 decrements its count G. The count G is outputted as a digital value to the VGA 162 for controlling the gain of the VGA. Thus, when the amplitude of $I_{vga2}$ is too big (outside the window $I_{desire}$), the hysteresis circuit 164, event detector 168 and counter 174 cause the gain G of the VGA 162 to decrease by one step. Otherwise, the timer 170 comparator 172 and counter 174 cause the gain G to increase by one step every 1500 nsec. This particular period is the maximum separation period of two available adjacent pulses of the received PPM signal.

Figure 5:
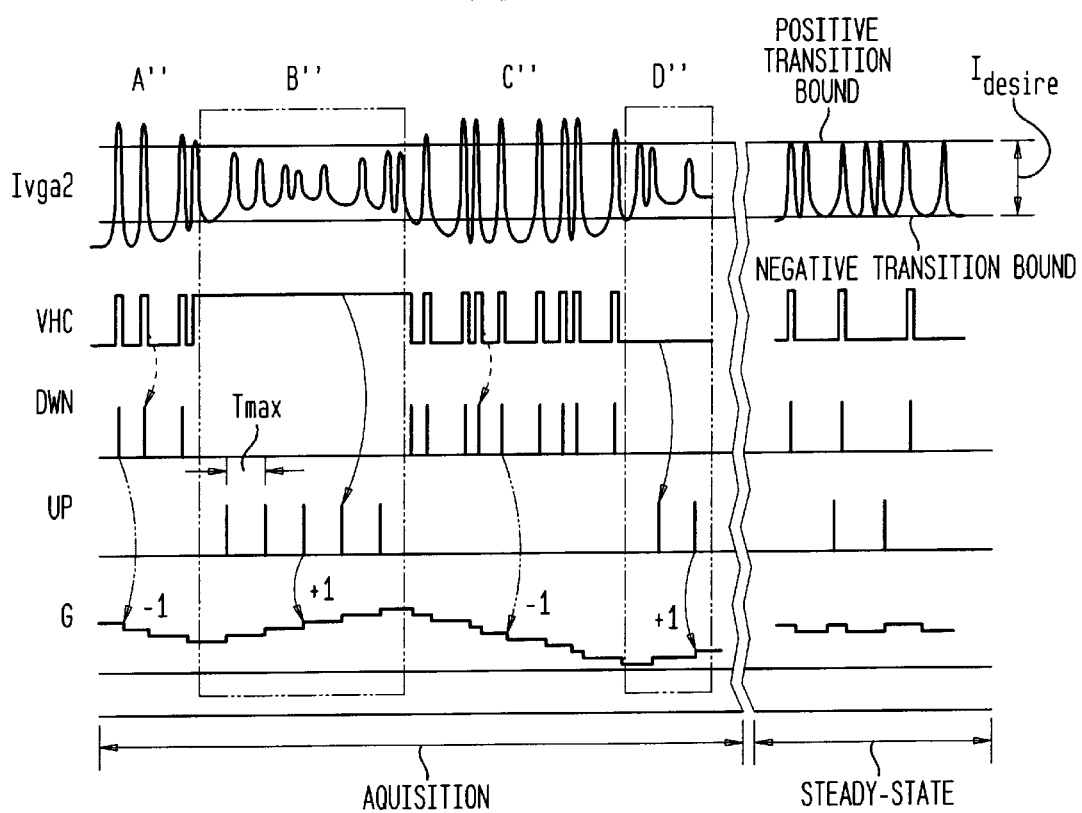
FIG. 5 shows a graph illustrating the gain adjustment of the variable gain amplifier of the receiver of the PPM transceiver of FIG. 1.

FIG. 5 illustrates the operation of the feedback path circuitry 164, 168, 170, 172 and 174. During an acquisition period, when the signal $I_{vga2}$ amplitude is large enough to swing across upper and lower bounds of the window $I_{desire}$, as shown at periods A'' and C'', a logic transition in signal $V_{HC}$ is triggered. The edge detector 168 detects the falling edges of the transitions in signal $V_{HC}$ and outputs pulses in the down count signal DWN. This resets the timer 170 and causes the counter 174 to reduce the gain G by one step per pulse of the signal DWN. On the other hand, during periods B'' and D'', the amplitude of the signal $I_{vga2}$ is small and stays within the bounds of $I_{desire}$. As such, no transition of $V_{HC}$ occurs during these periods B'' and D''. Nevertheless, whenever the timer 170 counts to the predetermined reference value $T_{MAX}$, the comparator resets the timer 170 count and outputs the up count signal UP. This causes the counter 174 to increase the gain G by one step per pulse of the signal UP. Eventually, a steady-state operating period is reached at which time the amplitude of signal $I_{vga2}$ stays very closely within the bounds of $I_{desire}$.

The current signal $I_{vga1}$, having an amplitude limited to the upper and lower bounds of $I_{desire}$, is received at the hysteresis slicer 176 having a hysteresis window $I_{slicer}$. The hysteresis slicer 176 outputs a low voltage level in signal $V_{out}$ when the amplitude of $I_{vga1}$ is less than the lower bound of $I_{slicer}$ and outputs a high voltage level in signal $V_{out}$ when the amplitude of $I_{vga1}$ is more than the upper bound of $I_{slicer}$. The lower bound of $I_{slicer}$ is higher than the lower bound of $I_{desire}$ and the upper bound of $I_{slicer}$ is lower than the upper bound of $I_{desire}$. This is desirable. As a result of this construction, part of the AM-suppression is performed using the linear AM-suppression VGA 162, as controlled by the feedback path, whereas the remainder of the AM-suppression is subsequently performed by the non-linear hysteresis slicer 176. Because the linear AM-suppression is performed before the non-linear AM-suppression, less jitter is introduced into the signal $V_{out}$. More specifically, given a band limited channel with an equivalent bandwidth of $1/\tau_0$ and corresponding minimum gain increment or step $G_{min}$ of VGA 162 for the maximum dynamic input of $I_{in}$, the residual jitter $\tau$ of the saturated output $V_{out}$ due to amplitude variation of $I_{in}$ is no more than:

$$\tau = 2\ln\left\{\frac{1 - \frac{G_{min}}{G_{min}+1}k}{1-k}\right\}\tau_0, \text{ (for } k < 1\text{)}$$

where k is the ratio of $I_{desire}$ to $I_{slicer}$. Jitter can be reduced by increasing $G_{min}$ or by decreasing k. Most significantly, jitter can be reduced by making $I_{slicer}$ smaller than $I_{desire}$ even though only a where k is the ratio of windows $I_{slicer}$ to $I_{desire}$. From inspection of the above relation, note that residual jitter $\tau$ can be reduced by minimizing k (i.e., making $I_{slicer}$ substantially smaller than $I_{desire}$) or increasing $G_{min}$. In short, residual jitter can be easily decreased by making $I_{slicer}$ smaller than $I_{desire}$.

Illustratively, the signal dynamic range of the PPM voltage signal $V_{in}$ varies about 20 dB, e.g., from about 20 millivolt peak to peak to about 200 millivolt peak to peak. It is desirable to vary the gain of the VGA 162 to regulate the signal level of the received PPM signal, e.g., to maintain a constant 200 millivolt peak to peak signal. Otherwise, the timing recovery circuit 180 and PPM decoder 154 are likely to malfunction. On the other hand, conventional AGC's that attempt to stabilize the peak-to-peak amplitude or dynamic range of a received pulse-modulated signal (also referred to as AM-suppression amplifiers) tend to introduce a large amount of jitter to the edges of the pulses of the received signal. This is particularly problematic for PPM and pulse-width modulated signals because the transmitted data resides in the positions of the pulse edges. Conventional solutions using automatic gain control or limiting amplifiers require either amplifiers with very fine amplitude control or wide-band amplification. However, the AGC 160 relaxes both of these constraints—only few, e.g., 64, amplification steps are provided in the VGA. Furthermore, the slicer 176 illustratively is not a wide-band slicer. Nevertheless, introduced jitter can be as low as 7.2° for a 1 MHz PPM data signal with a 20 dB input dynamic range.

Figure 6:
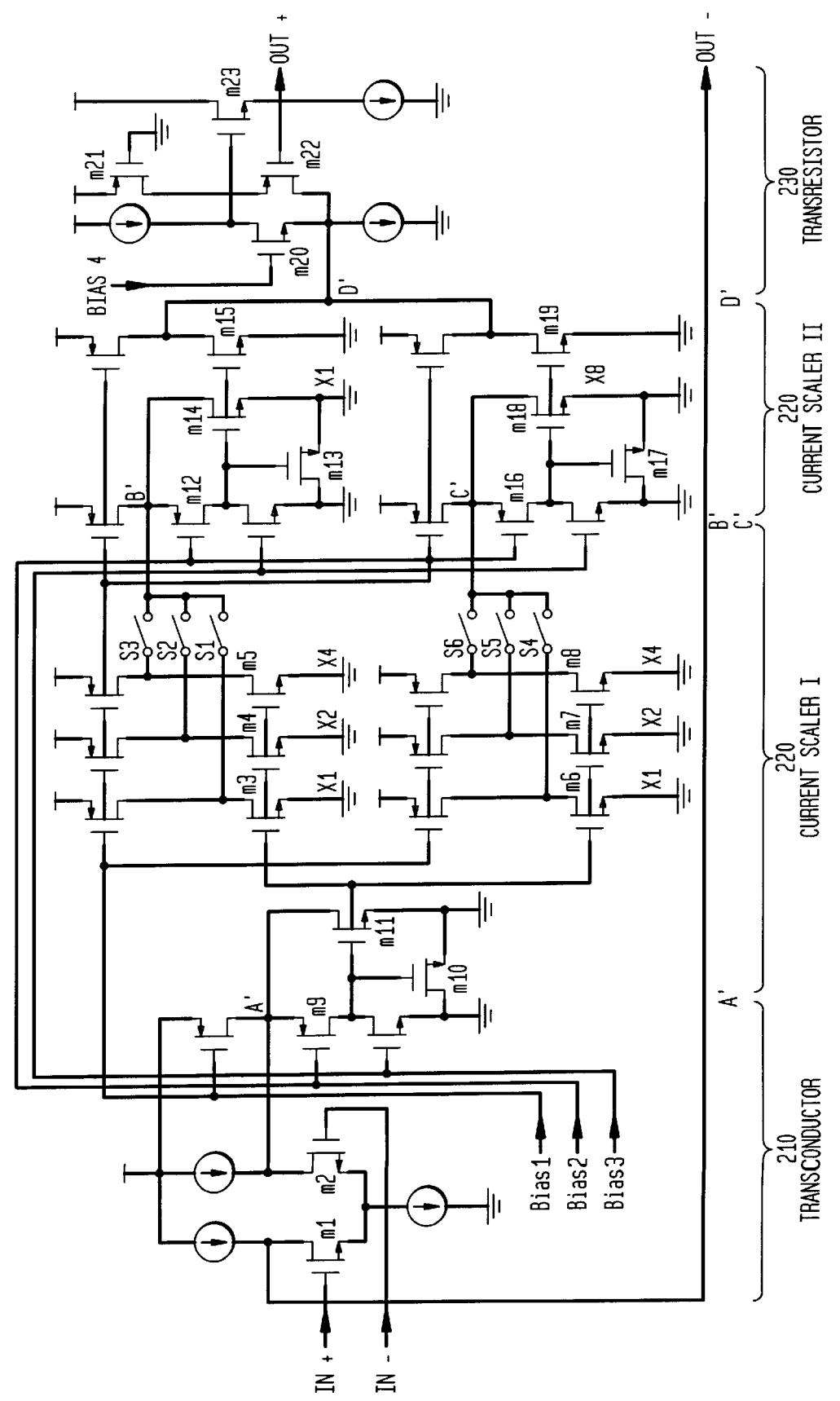
FIG. 6 shows a variable gain amplifier according to an embodiment of the present invention.

FIG. 6 shows the VGA 162 in greater detail. As shown, the VGA 162 is a fully differential amplifier with a transconductor stage 210, current scaler or amplifier stage 220 and transresistor stage 230. Only one half of the fully differential amplifier is fully shown—the missing half is a mirror image of the circuit shown. The PPM signal is received at nodes In+ and In−. The digital count value G outputted by the up/down counter 174 (FIG. 2) control switches s1–s6. Illustratively, the digital count value G is a six bit value, where each bit closes a respective switch if the bit is '1' or opens the switch if the bit is '0' (the least significant count bit controlling switch s1, the second least significant bit controlling s2, . . . , the most significant bit controlling s6).

Current mirror transistors m1 and m2 convert the PPM voltage signal inputted at nodes In+ and In− to a current signal at node A'. The current amplification of the PPM signal is then performed by transistors m3–m19. Shunt-shunt feedback connected transistors m9, m10 and m11 copy the current of node A' to the gates of transistors m3–m8. As is well known, the shunt-shunt structure of transistors m9–m11 provide a precise matching of the current and produces a low input impedance for the current scaler stage 220. As shown, the transistors m3–m5 are cascaded and amplify the PPM current signal of node A' by a gain of 1×, 2×, and 433 , respectively. The amplified current signals produced by the transistors m3–m5 are selectively coupled by switches s1, s2 and s3 to a node B' where the coupled current signals are superimposed (summed). Likewise, transistors m6–m8 are cascaded and amplify the current signal of node A' by a gain of 1×, 2× and 4×, respectively. The amplified current signals produced by the transistors m6–m8 are selectively coupled by switches s4, s5 and s6 to a node C' where the coupled current signals are superimposed. The current signal at node B' is copied to the drain of transistor m15 by transistors m12–m15. The current at the node C' is amplified 8× and the 8× amplified current signal is produced at the drain of transistor m19 by transistors m16–m19. Thus, the sum current at the node D' equals the current at node A'·[s1+2s2+4s3+8(s4+2s5+4s6)]. Again, transistors m12–1m14 and m16–m18 are connected in a shunt-shunt feedback configuration so as to precisely match the inputted current to the node D' and to produce a low input impedance for the transresistor stage 230. The binary weighted current produced at node D' is then converted back to a voltage by transistors m20–m23. Again, the transistors m20–m23 are connected in a shunt-shunt feedback path.

Referring again to FIG. 1, the timing recovery circuit 180 is now described. Each PPM signal transmission has a frame structure including a preamble. Illustratively, the preamble includes 56 logic '1' bits modulated onto the PPM signal. This is provided to enable the receiver to synchronize with a received PPM signal. The timing recovery circuit 180 achieves this using a frequency track, a slot locked loop and a phase locked loop. The frequency track includes a frequency detector 182 and a programmable counter 184. The slot locked loop includes a PPM encoder 186 (which can have a similar construction as the PPM encoder 112 of FIG. 2), a slot detector 188 and a 2-bit counter 190. The phase locked loop includes a phase detector 192 and the programmable counter 184. Illustratively, timing recovery is achieved by tracking the frequency of the received PPM signal using the frequency track, locking to the slots of the received PPM signal using the slot locked loop and then locking to the phase of the received PPM signal using the phase locked loop. Each of these operations is now described in greater detail.

The quantized, amplified PPM signal is outputted from the quantizer 176 to the frequency detector 182. At the beginning of the preamble, the central control unit 152 engages the frequency track, e.g., by transmitting an enabling signal to the programmable counter 184. The frequency detector 182 detects the frequency of the quantized PPM signal. Illustratively, the frequency detector 182 may be implemented with a pulse counter that receives the reference 36 MHZ clock. Such a pulse counter may count the number of clocks N of the 36 MHZ reference clock between rising edges of pulses of the quantized PPM signal. Note that the PPM signal preamble of all logic '1's produces a PPM signal with pulses in every first and third slot Such a signal has a frequency of 1 MHZ. Thus, there are N=36 clock pulses of the 36 MHZ reference clock between rising edges of pulses of the PPM signal preamble. The frequency detector 182 may output a value that depends on N, such as $Ns=(N+2)/4$, to the programmable counter 184. In response, the programmable counter 184 produces a coarse clock fx having almost double the frequency of the PPM signal preamble. Illustratively, the programmable counter 184 has a single output which changes its logic state from high to low or from low to high every Ns clocks of the 36 MHz clock. With $Ns=½N$, and N=36 for a 1 MHz PPM signal and a 36 MHz reference clock, the programmable counter 184 outputs a clock signal having a frequency of N/Ns (36/18) or 2 MHz.

After a certain period of time following engagement of the frequency track, the frequency track is presumed to have closely locked to the frequency of the received PPM signal. At such time, the central control unit 152 disengages the frequency track, e.g., by transmitting a signal to the programmable counter 184 which disables the frequency adjustment to the coarse clock signal fx. The central control unit 152 then engages the slot locked loop, e.g., by transmitting an enabling signal to the two bit counter 190. The PPM encoder 186 receives the coarse clock fx from the programmable counter 184 of the frequency track. The PPM encoder 186 can have a similar structure as the PPM encoder 112 of FIG. 2 but illustratively, receives varying control signals S0 and S1 as described in greater detail below. In response to the specific control signals S0 and S1 received at that moment, the PPM encoder 186 inserts pulses into specified slots of an outputted resampling clock signal fs.

The resampling clock signal fs is received at a slot detector 188. The slot detector 188 also receives the quantized PPM signal outputted from the quantizer 176. In response, the slot detector 188 compares the pulse occurrences of the resampling clock signal fs generated by the PPM encoder 186 to the pulse positions of the quantized PPM signal outputted form the slicer 176. In so comparing the pulses of these two PPM signals, the slot detector 188 generates a phase error between the two signals. In particular, the slot detector 188 determines whether or not the resampling clock signal fs overlaps the quantized PPM signal slot-wise—i.e., whether or not the pulses of the two signals are occurring in the same relative slots. If not, the two signals are more than 90° out of phase. If the resampling clock signal fs is more than 90° out of phase with the quantized PPM signal, the slot detector 188 outputs a pulse to the two bit counter 190. The pulse causes the two bit counter 190 to increment The count of the two bit counter 190 is outputted as the S1, S0 slot select control bits to the PPM encoder 186. Thus, if the resampling clock signal fs is more than 90° out of phase with the quantized PPM signal, the slot selection is adjusted. In short, the slot locked loop effects a slot search to identify the slot boundaries of the received PPM signal. Once the slots are locked, the two bit counter 190 is disabled from counting and instead stores the count so as to maintain production of the resampling clock signal fs in slot alignment with the quantized PPM signal.

After a certain period of time following the engagement of the slot locked loop (e.g., at the end of the preamble), the slot locked loop is presumed to have locked to the slots of the quantized PPM signal. At this time, the central control unit 152 disengages the slot locked loop, e.g., by transmitting a disabling signal to the two bit counter 190 that prevents the two bit counter 190 from counting. Thereafter, the central control unit 152 engages the phase locked loop, e.g., by transmitting an enabling signal to the phase detector 192. The phase detector 192 receives the coarse clock fx and the quantized PPM signal. The phase detector 192 determines a polarity of a phase error between the coarse clock fx and the quantized PPM signal. In response to the polarity of the phase difference, the phase detector 192 outputs an increase signal I (if the phase of the coarse clock fx lags the phase of the quantized PPM signal) or a decrease signal D (if the phase of the coarse clock fx leads the phase of the quantized PPM signal) to the programmable counter 184. In response, the programmable counter 184 adds a pulse to (if the increase signal I is received), or deletes a pulse from (if the decrease signal D is received), the normal speed of the 36 MHZ reference clock. This causes the pulses of the coarse clock to occur slightly sooner or later, respectively, in the coarse clock fx thereby adjusting the phase of the coarse clock fx. Note that the PPM encoder 186 is still encoding using the coarse clock signal fx. Thus, any adjustment to the phase of the coarse clock fx causes a like adjustment to the phase of the resampling clock signal fs.

After a certain time following the engagement of the phase locked loop, the phase can be presumed to be locked to the received PPM signal. Thus, the resampling clock signal fs outputted from the PPM encoder is synchronized in frequency, slot and phase to the received PPM signal and may be used to identify slot boundaries. The central control unit 152 therefore enables the PPM decoder 154 to decode the received PPM signal. The PPM decoder 154 receives the resampling clock signal fs and the quantized PPM signal and uses the resampling clock signal fs to identify the slots of the quantized PPM signal in which pulses may appear. With the slots identified, the PPM decoder 154 determines whether or not pulses are present in the respective slots and reconstructs the NRZ data signal from the quantized PPM signal.

Figure 7:
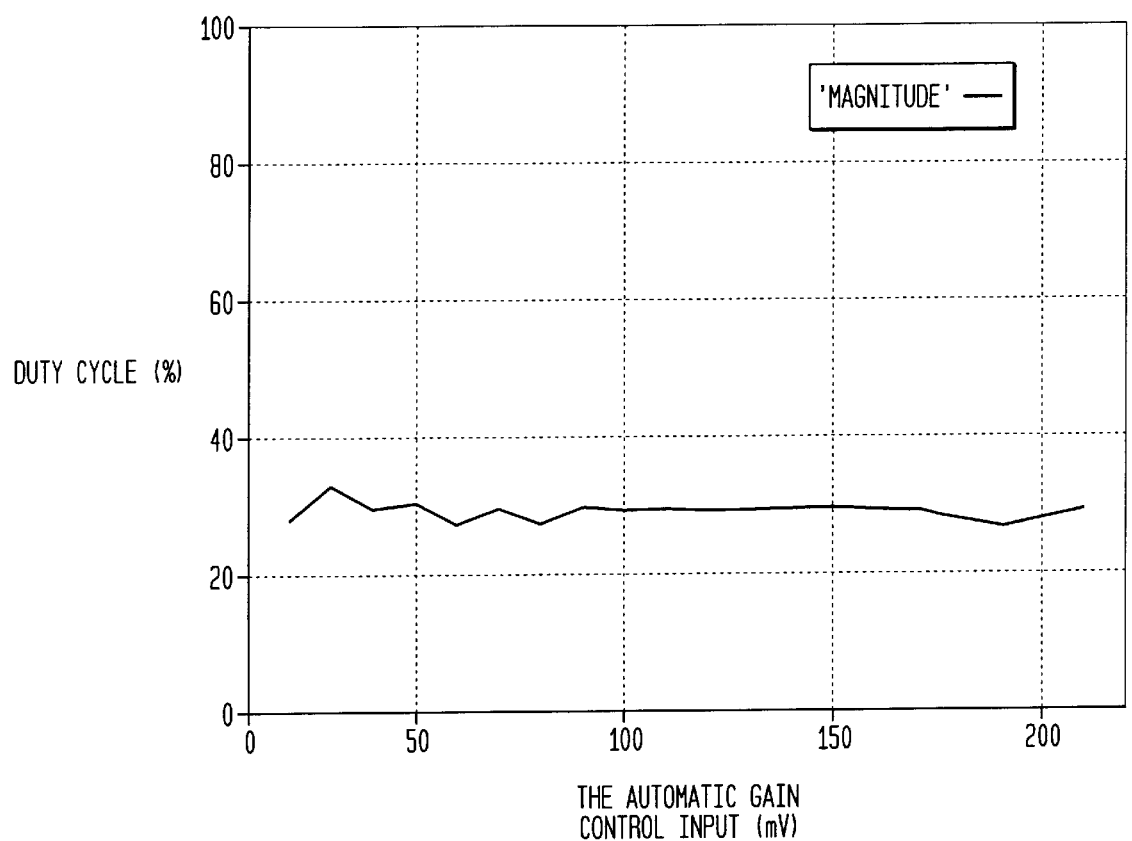
FIG. 7 shows a graph of duty cycle variation of amplified PPM signal level output of the AGC according to an embodiment of the present invention versus different input signal levels.
Figure 8A:
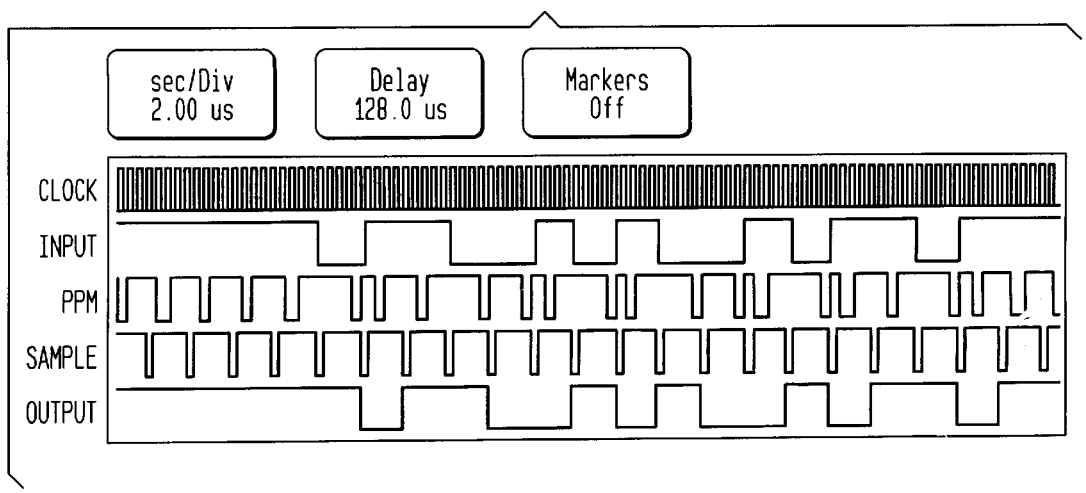
FIG. 8 shows a graph of input and output NRZ signals, transmitted PPM signals and a jitter eye diagram of transceivers according to an embodiment of the present invention.
Figure 8B:
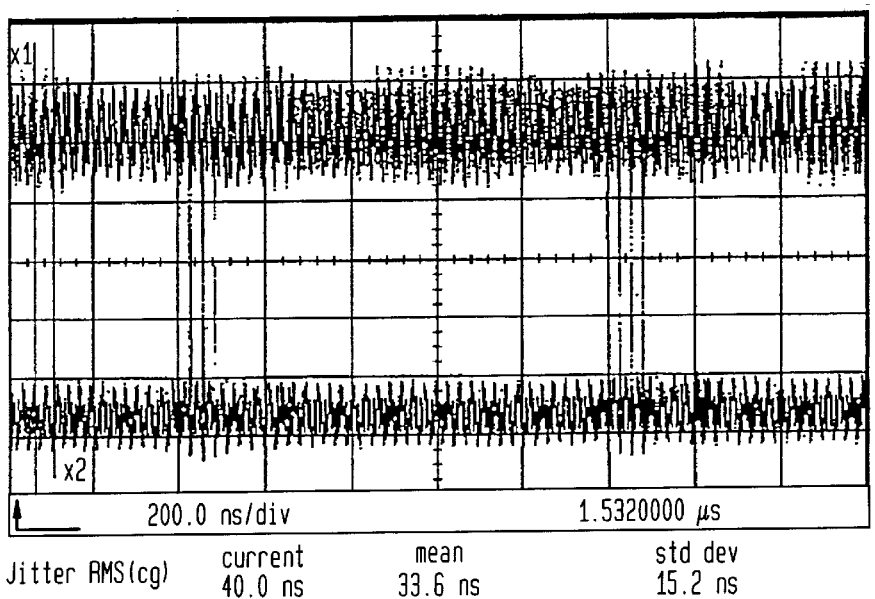

In a test integrated circuit, the measured PPM duty cycles variation of the AGC 160 output versus different input signal levels is shown in FIG. 7. As can be seen, the variations are less than ±3%. FIG. 8 shows the transient response of the regenerated NRZ data using the transmitter and receiver from different integrated circuits. The measured jitter of the eye diagram is about 33.6 nsecs.

The above discussion is intended to be merely illustrative of the invention. Those having ordinary skill in the art may devise numerous alternative embodiments without departing from the spirit and scope of the following claims.

The claimed invention is:

1. A method for pulse position modulating a non-return to zero signal (NRZ) comprising the steps of:
    (a) dividing the frequency of a clock signal to which the data of the NRZ signal are aligned to produce a half frequency clock signal,
    (b) selecting pulses of said clock signal and said half frequency clock signal depending on logic values of said NRZ signal and a control signal to produce first and second slot selected signals, and
    (c) mixing said first and second slot selected signals to produce a PPM signal of said NRZ signal.

2. The method of claim 1 further comprising the steps of:
    (d) eliminating a haze in said PPM signal.

3. The method of claim 1 wherein said NRZ signal has a frequency of X MHz, wherein said PPM signal is a $2^i$-ary PPM signal, where i is an integer,
    wherein said step (a) comprises producing i–1 clock signals $A_0, A_1, \ldots, A_{i-2}$, wherein each of said clock signals $A_j$ has a frequency of $2^{i-1}/[2^j \cdot (i-1)] \cdot X$ MHz, for $0 \leq j \leq i-2$, and
    wherein said step (b) comprises modulating, each of said clock signals $A_j$ with a corresponding $j^{th}$ bit of an i–1 bit symbol formed from i–1 bits of said NRZ signal, and combining said modulated clock signals to produce one of said first and second slot select signals.

4. A pulse position modulation encoder for encoding a non-return to zero (NRZ) signal comprising:
    (a) a frequency divider receiving a clock signal to which the data of the NRZ signal are aligned and dividing said clock signal to produce a half frequency clock signal,
    (b) a slot selector receiving said clock signal, said half frequency clock signal said NRZ signal, and a control signal, and selecting pulses of said clock signal and said half frequency clock signal depending on logic values of said NRZ signal and a control signal to produce first and second slot selected signals, and
    (c) a mixer receiving said first and second slot selected signals and mixing said first and second slot selected signals to produce a PPM signal of said NRZ signal.

5. The pulse position modulation encoder of claim 4 further comprising:
    (d) a haze eliminator, receiving said PPM signal and eliminating a haze in said PPM signal.

6. The pulse position modulation encoder of claim 4 wherein said NRZ signal has a frequency of X MHZ, wherein said PPM signal is a $2^i$-ary PPM signal, where i is an integer,
    wherein said frequency divider comprises a counter producing i–1 clock signals $A_0, A_1, \ldots, A_{i-2}$, wherein each of said clock signals $A_j$ has a frequency of $2^{i-1}/[2^j \cdot (i-1)] \cdot X$ MHz, for $0 \leq j \leq i-2$, and
    wherein said slot selector comprises a plurality of first logic gates, including one first logic gate corresponding to each of said clock signals $A_j$, each of said first logic gates modulating said corresponding clock signal $A_j$ with a corresponding $j^{th}$ bit of an i–1 bit symbol formed from i–1 bits of said NRZ signal, said slot selector also comprising a second logic gate for combining said modulated clock signals to produce one of said first and second slot select signals.

7. A method for locking synchronization to a pulse position modulated (PPM) signal comprising the steps of:
    (a) generating a coarse clock fx having a frequency that depends on a frequency of said PPM signal,
    (b) generating a resampling clock signal having a frequency that depends on said coarse clock fx and slots locked to slots of said PPM signal, and
    (c) locking a phase of said coarse clock fx to a phase of said PPM signal.

8. The method of claim 7 wherein said step (a) further comprises the steps of:
    (a1) counting the number N of clock pulses of a reference clock between rising edges of said PPM signal on which a sequence of logic '1' data bits is modulated, and
    (a2) generating said coarse clock fx having a frequency that depends on a frequency of said PPM signal on which said sequence of logic '1' data bits is modulated.

9. The method of claim 7 wherein said step (b) further comprises the steps of:
    (b1) selecting specific slots of said coarse clock fx as determined by dynamically varying slot selection signals,
    (b2) comparing pulses of said resampling clock signal to said PPM signal to determine a phase error between said resampling PPM signal and said PPM signal,
    (b3) if said phase error exceeds 90°, varying said slot selection signals.

10. The method of claim 9 wherein said slot selection signals are one or more bits of a count, said step (b3) further comprising the step of incrementing said count.

11. The method of claim 7 wherein said step (c) further comprises the steps of:
    (c1) determining a polarity of a phase error between said coarse clock fx and said PPM signal, and
    (c2) inserting or deleting a pulse into said coarse clock fx depending on a polarity of said phase error.

12. A timing recovery circuit for locking synchronization to a pulse position modulated (PPM) signal comprising:
    (a) a frequency track receiving said PPM signal and generating a coarse clock fx having a frequency that depends on a frequency of said PPM signal,
    (b) a slot locked loop receiving said PPM signal and said coarse clock and generating a resampling clock signal fs having a frequency that depends on said coarse clock fx and having slots locked to slots of said PPM signal, and
    (c) a phase locked loop receiving said PPM signal and said coarse clock fx and locking a phase of said coarse clock fx to a phase of said PPM signal.

13. The timing recovery circuit of claim 12 wherein said frequency track further comprises:
    (a1) a counter receiving said PPM signal and counting the number N of clock pulses of a reference clock between rising edges of said PPM signal on which a sequence of logic '1' data bits is modulated, and
    (a2) a counter receiving a value that depends on said number N and generating said coarse clock fx having a frequency that depends on a frequency of said PPM signal on which said sequence of logic '1' data bits is modulated.

14. The timing recovery circuit of claim 12 wherein said slot locked loop comprises:
   (b1) a PPM encoder receiving said coarse clock, selecting specific slots of said coarse clock fx as determined by dynamically varying slot selection signals and generating said resampling clock fs with pulses in selected slots,
   (b2) a slot detector receiving said resampling clock and said PPM signal, comparing pulses of said resampling clock signal to said PPM signal to determine a phase error between said resampling PPM signal and said PPM signal and outputting a control signal if said phase error exceeds 90°, and
   (b3) a circuit receiving said control signal outputted from said slot detector and varying said slot selection signals.

15. The timing recovery circuit of claim 14 wherein said circuit is a counter, wherein said slot selection signals are one or more bits of a count, said counter incrementing said count in response to said control signal.

16. The timing recovery circuit of claim 12 wherein said phase locked loop comprises:
   (c1) a phase detector receiving said coarse clock fs and said PPM signal, determining a polarity of a phase error between said coarse clock fx and said PPM signal, and outputting an increment or decrement control signal depending on said polarity, and
   (c2) a counter receiving said increment and decrement control signal and inserting or deleting a pulse into said coarse clock fx in response to said increment or decrement signal, respectively.

17. A transceiver comprising:
   a pulse position modulation encoder comprising:
      a frequency divider receiving a clock signal to which the data of a to-be-transmitted NRZ signal are aligned and dividing said clock signal to produce a half frequency clock signal,
      a slot selector receiving said clock signal, said half frequency clock signal said NRZ signal, and a control signal, and selecting pulses of said clock signal and said half frequency clock signal depending on logic values of said NRZ signal and a control signal to produce first and second slot selected signals, and
      a mixer receiving said first and second slot selected signals and mixing said first and second slot selected signals to produce a transmitted PPM signal of said NRZ signal,
   an automatic gain control circuit for regulating the signal level of a received PPM signal comprising:
      a variable gain amplifier receiving said received PPM signal and an inputted digital control value and amplifying said received PPM signal using a dynamically adjusted gain that depends on said inputted digital control value,
      a counter for incrementing said inputted digital control value according to a clock signal to increase said gain, and
      a circuit for receiving said amplified PPM signal, detecting a signal level of said amplified signal, and if said detected signal level is outside of a predetermined signal level range, outputting a signal to said counter for decreasing said inputted digital control value to decrease said gain, and
   a timing recovery circuit for locking synchronization to said amplified PPM signal comprising:
      a frequency track receiving said amplified PPM signal and generating a coarse clock fx having a frequency that depends on a frequency of said amplified PPM signal,
      a slot locked loop receiving said amplified PPM signal and said coarse clock and generating a resampling clock signal fs having a frequency that depends on said coarse clock fx and having slots locked to slots of said amplified PPM signal, and
      a phase locked loop receiving said amplified PPM signal and said coarse clock fx and locking a phase of said coarse clock fx to a phase of said amplified PPM signal.

* * * * *